United States Patent [19]

Tanaka et al.

[11] Patent Number: 4,857,864
[45] Date of Patent: Aug. 15, 1989

[54] CURRENT MIRROR CIRCUIT

[75] Inventors: Tatsuo Tanaka, Yokohama; Yoshihiro Yoshida, Tokyo, both of Japan

[73] Assignee: Kabushiki Kaisha Toshiba, Kawasaki, Japan

[21] Appl. No.: 201,218

[22] Filed: Jun. 2, 1988

[30] Foreign Application Priority Data

Jun. 5, 1987 [JP] Japan ................................ 62-140994
Jun. 5, 1987 [JP] Japan ................................ 62-140995

[51] Int. Cl.$^4$ ............................................. H03F 3/04
[52] U.S. Cl. ..................................... 330/288; 323/315
[58] Field of Search ................ 330/257, 288; 323/315, 323/316

[56] References Cited

U.S. PATENT DOCUMENTS 3,566,289  2/1971  Cope ..................................... 330/19
4,528,496  7/1985  Naokawa et al. ................ 330/288 X

FOREIGN PATENT DOCUMENTS 181807  10/1984  Japan ..................................... 330/257
160708  8/1985  Japan ..................................... 330/288

Primary Examiner—James B. Mullins
Attorney, Agent, or Firm—Finnegan, Henderson, Farabow, Garrett, & Dunner

[57] ABSTRACT

A current mirror circuit which comprises a current input terminal, a current output terminal, an input-current supplying section, a first transistor, and a second transistor. The input-current supplying section supplies an input current to the current input terminal. The first transistor has a collector coupled to the current input terminal, an emitter coupled to a first power-supply potential terminal, and a base. The second transistor has a collector connected to the current output terminal, an emitter coupled to the first power-potential terminal, and a base connected to the base of the first transistor. The current mirror circuit further comprises a third transistor and a current mirror section. The third transistor a collector, a base coupled to the collector of the first transistor, and an emitter coupled to the first power-supply potential terminal. The current mirror section supplies a current proportionate to the collector current of the third transistor, to the bases of the first and second transistors.

10 Claims, 3 Drawing Sheets

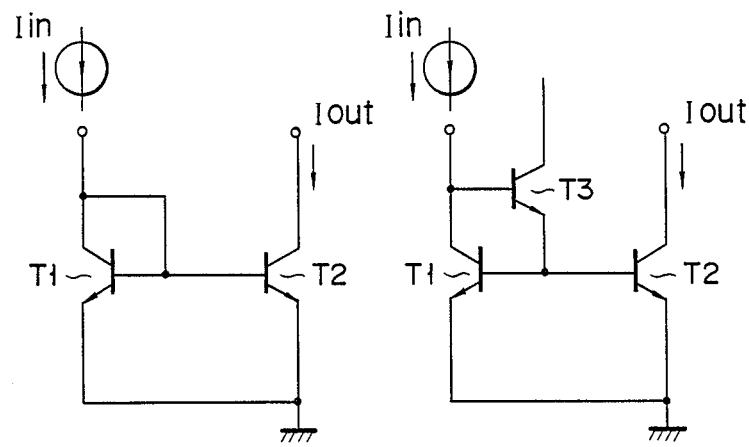
F I G. 1 (PRIOR ART)
F I G. 2 (PRIOR ART)
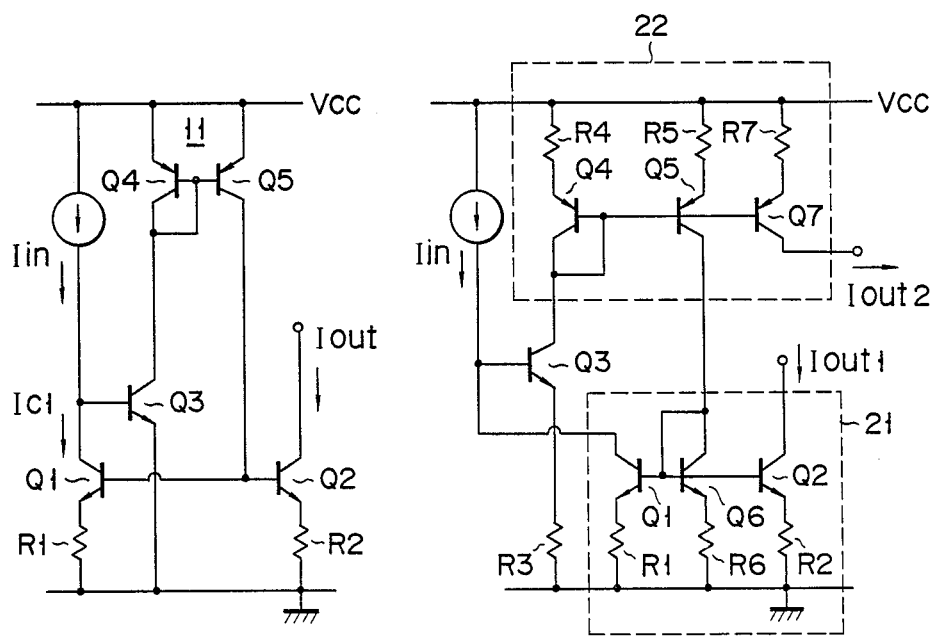
F I G. 3
F I G. 4

CURRENT MIRROR CIRCUIT

BACKGROUND OF THE INVENTION

1. Field of the Invention

The present invention relates to a current mirror circuit, and more particularly, to a current mirror circuit which can operate at a low voltage, and can output a current equal to the input current even if the constituent transistors have a relatively small current-amplification factor $\beta$.

2. Description of the Related Art

FIG. 1 attached hereto shows a typical current mirror circuit hitherto known, which is comprised of NPN transistors T1 and T2. If transistors T1 and T2 had the same current-amplification factor $\beta$ which is infinitely great, the collector current of transistor T2, i.e., the output current Iout of the current mirror circuit, should be equal to the input current Iin supplied to the collector of transistor T1. In effect, since the current-amplification factor $\beta$ of NPN transistors T1, T2 is limited, the output current Iout depends on $\beta$ and is less than the input current Iin, as is evident from the following equations:

$$Iout = Ic2 = Ic1 = Iin/[1+(2/\beta_N)]$$

where Ic1 is the collector current of transistor I1, Ib1 is the base current of transistor T1, Ic2 is the collector current of transistor T2, and $\beta_N$ is the emitter-ground current-amplification factor of transistors T1 and T2. When $\beta_N$ is 350, 70, 20, and 10, Iout and Iin will have the following relationship:

Iout = 0.9943 Iin ($\beta_N$ = 350)

Iout = 0.9722 Iin ($\beta_N$ = 70)

Iout = 0.9091 Iin ($\beta_N$ = 20)

Iout = 0.8333 Iin ($\beta_N$ = 10)

Obviously, the ratio of Iout to Iin greatly depends upon the current-amplification factor $\beta$ of transistor T1 and T2.

FIG. 2 shows an improved current mirror circuit, wherein the ratio of Iout to Iin is less dependent on the current amplification factor $\beta$ of transistor T1 and T2. This circuit differs from the circuit of FIG. 1 in that NPN transistor T3 is coupled between the collector of transistor T1 and the base of transistor T2. Since the collector current of transistor T3 is supplied to the bases of transistors T1 and T2, the ratio of Iout to Iin is less dependent upon $\beta$. More specifically, in the circuit shown in FIG. 2, Iout is given as:

$$Iout = Iin[1+(2/\beta_N^2)]$$

Therefore:

Iout = 0.9999 Iin ($\beta_N$ = 350)

Iout = 0.9996 Iin ($\beta_N$ = 70)

Iout = 0.9950 Iin ($\beta_N$ = 20)

Iout = 0.9804 Iin ($\beta_N$ = 10)

Although the ratio of Iout to Iin is considerably less dependent on $\beta$ than in the circuit of FIG. 1, the circuit of FIG. 2 can not operate so efficiently at a low voltage as the current mirror circuit shown in FIG. 1. This is because the input-terminal voltage of the circuit shown in FIG. 2 is 1.4 V, i.e., the sum of the base-emitter voltage Vbe1 of transistor T1 and the base-emitter voltage Vbe3 of transistor T3, whereas the input-terminal voltage of the circuit shown in FIG. 1 is only 0.7 V, i.e., the base-emitter voltage Vbe1 of transistor T1.

SUMMARY OF THE INVENTION

It is accordingly the object of this invention to provide a current mirror circuit whose dependency on the current-amplification factor $\beta$ of the constituent transistors is small, whose output current is almost equal to the input current, and which can operate at a sufficiently low voltage.

According to the present invention, there is provided a current mirror circuit which comprises: a current input terminal; a current output terminal; a current input section for supplying an input current to the current input terminal; a first transistor having a collector coupled to the current input terminal, an emitter coupled to a first power-supply potential terminal, and a base; a second transistor having a collector connected to the current output terminal, an emitter coupled to the first power-supply potential terminal, and a base connected to the base of the first transistor; a third transistor having a base connected to the collector of the first transistor, an emitter coupled to the first power-supply potential terminal, and a collector; and a current mirror section for supplying the bases of said first and second transistors with a current which is proportionate to the collector current of the third transistor.

Since the collector current of the third transistor is supplied by the current mirror section to the bases of the first and second transistors, the operation characteristic of this current mirror circuit does not depend so much upon the current-amplification factor $\beta$ the transistors. In addition, since the emitter of the third transistor is connected to the first power-supply potential terminal, the voltage at the current input terminal can be sufficiently low.

BRIEF DESCRIPTION OF THE DRAWINGS

FIG. 1 is a circuit diagram showing a conventional current mirror circuit;

FIG. 2 is a circuit diagram showing another conventional current mirror circuit;

FIG. 3 is a circuit diagram illustrating a current mirror circuit according to a first embodiment of the present invention;

FIG. 4 is a circuit diagram showing a current mirror circuit according to a second embodiment of the invention;

DETAILED DESCRIPTION OF THE PREFERRED EMBODIMENTS

Figure 5:
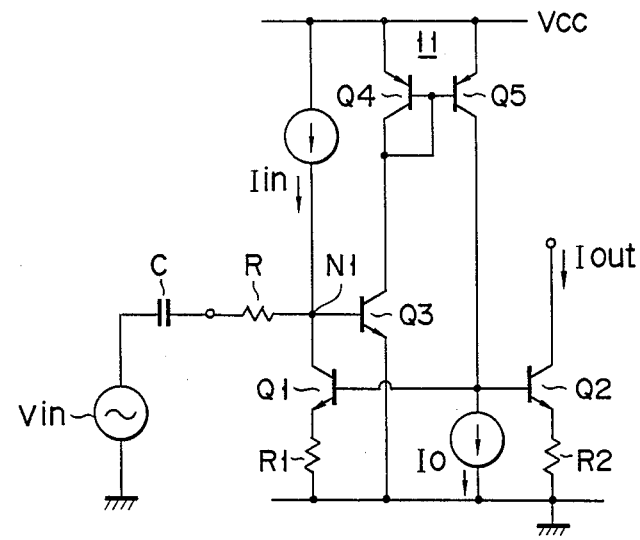
FIG. 5 is a circuit diagram illustrating a voltage/current conversion circuit which is a third embodiment of this invention and which includes the current mirror circuit shown in FIG. 3.

FIG. 3 shows a current mirror circuit according to a first embodiment of the present invention. As is illustrated in this figure, the bases of NPN transistors Q1 and Q2 are connected to each other. An input current Iin is supplied to the collector of transistor Q1. The collector of transistor Q2 is used as the output current terminal for supplying an output current Iout. The emitter of NPN transistor Q1 is connected by resistor R1 to the ground, and the emitter of NPN transistor Q2 is connected by resistor R2 to the ground. The base of NPN transistor Q3 is coupled to the collector of transistor Q1. The emitter of transistor Q3 is connected to the ground, and the collector thereof is coupled to the collector of PNP transistor Q4. The base and collector of transistor Q4 are mutually connected. The base of this transistor Q4 is connected to the base of PNP transistor Q5. The emitters of transistors Q4 and Q5 are coupled to power-supply terminal Vcc. Hence, PNP transistors Q4 and Q5 constitute current mirror section 11. The collector of PNP transistor Q5 is connected to the common base of NPN transistors Q1 and Q2.

A current, which is proportionate to the collector current Ic1 of transistor Q1, flows to the common base of transistors Q1 and Q2 through NPN transistor Q3 and current mirror section 11. As a result, the difference between the input current Iin and the output current Iout can be sufficiently reduced.

The input current Iin and the output current Iout can be represented as follows:

$$\begin{aligned} Iin &= Ic1 + Ib3 \\ &= Ic1 + (1 + 2/\beta_P)(Ic4/\beta_N) \\ &= Ic1 + (1 + 2/\beta_P)(2Ic1/\beta_N^2) \end{aligned}$$

Therefore:

$$\begin{aligned} Iout &= Ic2 = Ic1 \\ &= \frac{1}{1 + (1 + 2/\beta_P)\, 2/\beta_N^2} Iin \end{aligned}$$

where Ic1 to Ic5 are the collector currents of transistors Q1 to Q5, Ib1 to Ib5 are the base currents of transistors Q1 to Q5, $\beta_N$ is the current-amplification factor of NPN transistors Q1 to Q3, and $\beta_P$ is the current-amplification factor of PNP transistor Q4 and Q5.

When $\beta_N$ is 350, 70, 20, and 10, Iout and Iin will have the following relationship:

Iout=0.9999 Iin ($\beta_N$=350)

Iout=0.9995 Iin ($\beta_N$=70)

Iout=0.9940 Iin ($\beta_N$=20)

Iout=0.9766 Iin ($\beta_N$=10)

The values given above are obtained when the minimum value for $\beta_P$ is 10. As can be evident from the values specified above, the circuit shown in FIG. 3 can compensate for $\beta$ as effectively as the circuit illustrated in FIG. 2. In addition, it can operate at a voltage lower than the operation voltage of the circuit shown in FIG. 2, since the emitter of transistor Q3 is coupled to the ground, and the voltage at the Iin-input terminal is about 0.7, that is, similar to the base-emitter voltage Vbe3 of transistor Q3.

FIG. 4 shows a current mirror circuit according to a second embodiment of the invention. This circuit is designed so as to generate, from one input current, two output currents which flow in the opposite directions. The circuit is different from the circuit shown in FIG. 3, in that it has two additional transistors, i.e., NPN transistor Q6 and PNP transistor Q7. Transistor Q7 is used to supply the second output current Iout. In this circuit, the emitters of PNP transistors Q4 and Q5 are connected to power-supply terminal Vcc by resistors R4 and R5, respectively. The emitter of NPN transistor Q3 is coupled to the ground by resistor R3. The emitters of NPN transistors Q1 and Q2 are also coupled to the ground, by resistors R1 and R2, respectively. The base and collector of transistor Q6 are connected to the common base of transistors Q1 and Q2. The emitter of transistor Q6 is coupled to the ground by resistor R6. The base of PNP transistor Q7 is connected to the common base of transistors Q4 and Q5. The emitter of transistor Q7 is coupled to the power-supply terminal Vcc by resistor R7, and the collector thereof functions as the terminal for supplying the second output current Iout2. Hence, in the circuit of FIG. 4, NPN transistors Q1, Q2, and Q6 constitute first current-mirror section 21, and PNP transistors Q4, Q5, and Q7 constitute second current-mirror section 22. Transistor Q3, second current-mirror section 22, and first current-mirror section 21 form a feedback loop, which compensates for the current-amplification factors $\beta$ of the transistors of both polarities, i.e., the NPN transistors and the PNP transistors. As a result, the first output current Iout1 and the second output current Iout2 are nearly equal. The first output current Iout1 and the second output current Iout2 are given as follows:

$$Iout1 = \frac{1}{1 + \frac{1}{\beta_N}\left(1 + \frac{3}{\beta_P}\right)\left(1 + \frac{3}{\beta_N}\right)} Iin$$

$$Iout2 = \frac{\left(1 + \frac{3}{\beta_N}\right)}{1 + \frac{1}{\beta_N}\left(1 + \frac{3}{\beta_P}\right)\left(1 + \frac{3}{\beta_N}\right)} Iin$$

Assuming the minimum value for $\beta_N$ is 70, and the minimum value for $\beta_P$ is 10, then:

Iout1=0.9810 Iin

Iout2=1.0230 Iin

Obviously, both the first output current and the second output current little depend upon the current-amplification factors of the transistors. Since the second output current Iout2 is greater than the input current Iin, the circuit shown in FIG. 4 effectively functions, particularly when it is incorporated in a semiconductor circuit which comprises transistors having relatively small current-amplification factors $\beta$ and which is, therefore, has but a small current gain.

FIG. 5 illustrates a voltage/current conversion circuit according to a third embodiment of the present invention. The circuit shown in FIG. 3 can be modified into a voltage/current (V/I) conversion circuit, merely by connecting the node of the collector of transistor Q1 and the base of transistor Q3 with the voltage signal source Vin by means of a series circuit of a resistor R and a capacitor C. Unless any other measure is taken, however, the V/I conversion circuit will output a current which is not sufficiently proportionate to the input voltage. To render the output current sufficiently proportionate to the input voltage, a current source I0 is connected between the ground and the common base of transistors Q1 and Q2, as is illustrated in FIG. 5. Since the collector current of transistor Q3 is approximately equal to the current supplied by the current source $I_0$, the AC impedance with respect to node N1 can be reduced by increasing the output current of current source $AI_0$. The base-emitter voltage Vbe3 of transistor Q3 remains almost unchanged despite the fluctuation of the input current. Therefore, the V/I conversion circuit shown in FIG. 5 can output a current which is sufficiently proportionate to the input voltage.

Figure 6:
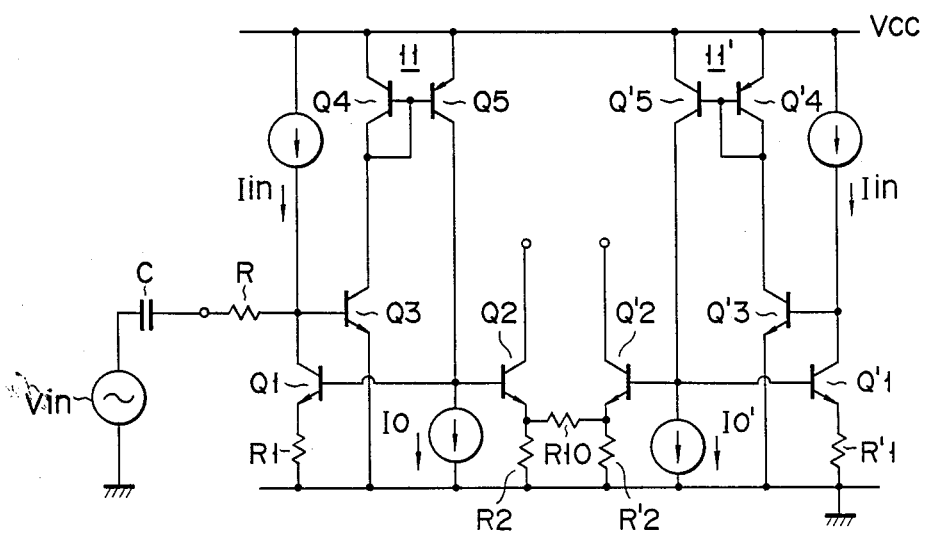
FIG. 6 is a circuit diagram illustrating a modification of the voltage/current conversion circuit (FIG. 5), which is a fourth embodiment of the present invention.

FIG. 6 shows a fourth embodiment of the invention, which is a differential amplifier. This differential amplifier has two V/I conversion circuits identical to the one illustrated in FIG. 5. The emitter of transistor Q2, which is used as a current-outputting element in the first V/I conversion circuit, is connected to the emitter of transistor Q2' which is used as a current-outputting element in the second V/I conversion circuit, whereby the two V/I conversion circuits constitute a differential amplifier. A voltage signal source Vin is coupled to the current-input terminal of the first V/I conversion circuit by means of the serial circuit comprised of a resistor R and a capacitor C. The first output current and the second output current, which are proportionate to the voltage signal supplied from the source Vin, are supplied from the collectors of transistors Q2 and Q2', respectively. The ratio between the collector currents of these transistors Q2 and Q2' is determined by the resistance ratio between resistor R10 and resistor R2 or resistor R2'. Thus, two different output currents are generated from one input voltage signal.

Resistors R10, R2, and R2' constitute a delta-type circuit. This delta-type circuit can perform so-called Δ-Y conversion, and has, of course, an operation characteristic which is similar to that of a Y-type circuit.

A differential amplifier of the type shown in FIG. 6 can be made by combining two circuits identical to the one shown in FIG. 3, or to the one illustrated in FIG. 4.

Figure 7:
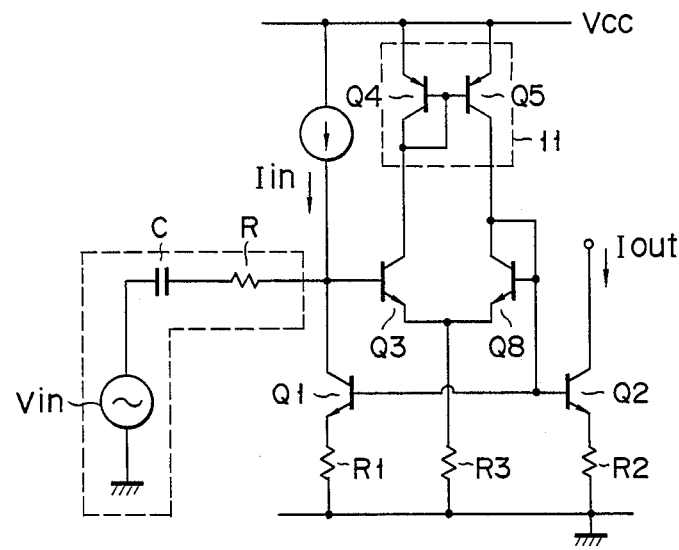
FIG. 7 is a circuit diagram representing a current mirror circuit according to a fifth embodiment of this invention.

FIG. 7 shows a current mirror circuit according to a fifth embodiment of this invention. This circuit comprises NPN transistors Q3 and Q8, current mirror circuit 11, resistor R3, and transistors Q1 and Q2. Transistors Q3 and Q8, circuit 11, and resistor R3 constitute a differential amplifier. The output of the differential amplifier is supplied to the common base of transistors Q1 and Q2, thereby compensating for the current-amplification factors $\beta$ of transistors Q1 and Q2. As is shown in FIG. 7, the base and collector of NPN transistor Q8 are connected to each other. The base-collector node is coupled to the collector of PNP transistor Q5, and also to the common base of NPN transistors Q1 and Q2. The emitter of transistor Q8 is coupled to the emitter of transistor Q3. The emitters of transistors Q3 and Q8 are grounded by means of resistor R3.

The collector current of transistor Q3 is supplied to the common base of transistors Q1 and Q2, as in the case of the current mirror circuit illustrated in FIG. 3. The circuit of FIG. 7 can, therefore, compensate for the current-amplification factors $\beta$ of transistors Q1 and Q2, thereby to make the output current Iout nearly equal to the input current Iin.

In the circuit of FIG. 7, transistor Q8 functions as a diode, and the potential at the common base of transistors Q1 and Q2 is constant despite the changes of the ambient temperature. Therefore, the circuit will output a stable current if the collector of transistor Q1 is connected to the voltage signal source Vin by the series circuit formed of the resistor R and the capacitor C, thus forming a voltage/current conversion circuit, as is shown in FIG. 7.

Figure 8:
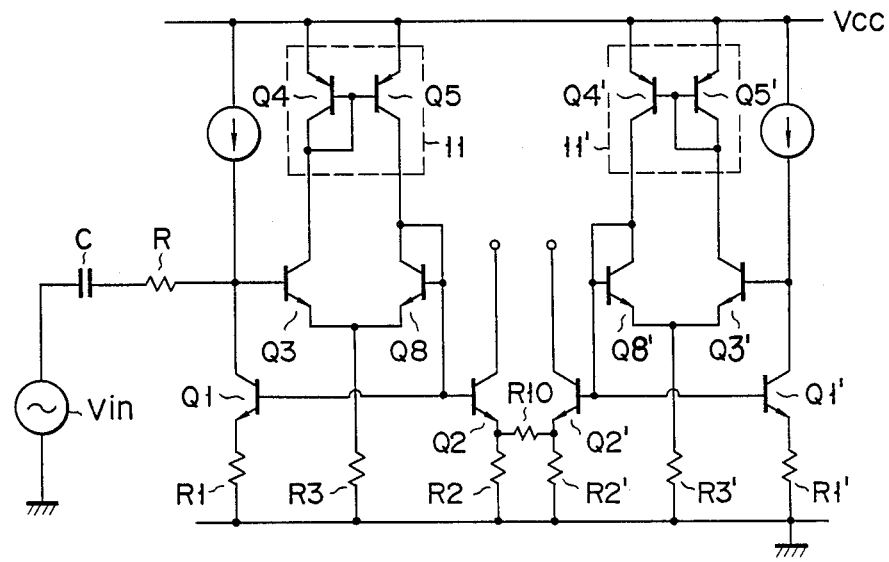
FIG. 8 is a circuit diagram showing a voltage/current conversion circuit which is s sixth embodiment of the present invention and which includes the current mirror circuit shown in FIG. 7.

FIG. 8 shows a sixth embodiment of the invention, which is a differential amplifier comprising two current mirror circuits identical to the one illustrated in FIG. 7. The emitter of transistor Q2 which is used as a current-outputting element in the first current mirror circuit is connected to the emitter of transistor Q2' which is used as a curent-outputting element in the second current mirror circuit, by means of resistor R10. A voltage signal source Vin is coupled to the collector of transistor Q1, whhich serves as the current-input terminal of the first current mirror circuit. The first and second output currents, which are determined by the voltage signal supplied from source Vin, are supplied from the collectors of transistors Q2 and Q2', respectively. The ratio between the collector currents of these transistors Q2 and Q2' is determined by the resistance ratio between resistor R10 and resistor R2 or R2'. Thus, two output currents are generated from one input signal.

Needless to say, the delta-type circuit comprised of resistors R2, R2', and R10 can perform Δ-Y conversion, and has an operation characteristic which is similar to that of a Y-type circuit.

What is claimed is:
1. A current mirror circuit comprising:
   a current input terminal;
   a current output terminal;
   input-current supplying means for supplying an input current to said current input terminal;
   a first transistor having a collector coupled to said current inputterminal, an emitter coupled to a first power-supply potential terminal, and a base;
   a second transistor having a collector connected to the current output terminal, an emitter coupled to the first power-supply potential terminal, and a base connected to the base of said first transistor;
   a third transistor having a base connected to the collector of said first transistor, an emitter coupled to the first power-supply potential terminal, and a collector;
   current mirror means coupled to the collector of said third transistor for supplying the bases of said first and second transistors with a current which is proportionate to the current in the collector of said third transistor; and
   a current source connected between the bases of said first and second transistors and said first power-supply potential terminal.

2. The current mirror circuit according to claim 1, wherein said current means includes a fourth transistor having a collector and a base, both connected to the collector of said third transistor, and an emitter coupled to a second power-supply potential terminal, and a fifth transistor having a base connected to the base of said fourth transistor, an emitter coupled to a second power-supply potential terminal and a collector coupled to the common bases of said first and second transistors.

3. The current mirror circuit according to claim 1, further comprising a voltage signal source for supplying a voltage signal to said current input terminal, thereby causing said current mirror circuit to generate an output current at said current output terminal corresponding to the voltage signal.

4. A current mirror circuit commprising:
   first and second current input terminals;
   first and second current output terminals;
   first and second input-current supplying means for supplying an input current to said first and second current input terminals, respectively;
   a first transistor having a base, a collector coupled to said first current input terminal, and an emitter coupled to a first power-supply potential terminal;
   a second transistor having a collector connected to said first current output terminal, an emitter coupled to said first power-supply potential terminal, and a base connected to the base of said first transistor;
   a third transistor having a collector, a base coupled to the collector of said first transistor, and an emitter coupled to said first power-supply potential terminal;
   first current mirror means coupled to the collector of said third transistor for supplying a current proportionate to the current in the collector of said third transistor, to the bases of said first and second transistors;
   a first current source connected between the bases of said first and second transistors and said first power-supply potential terminal;
   a fourth transistor having a base, a collector coupled to said second current input terminal, and an emitter coupled to said first power-supply potential terminal;
   a fifth transistor having a collector connected to said second current output terminal, an emitter coupled to the emitter of said second transistor, and a base connected to the base of said fourth transistor;
   a sixth transistor having a collector, a base coupled to the collector of said fourth transistor, and an emitter coupled to said first power-supply potential terminal;
   second current mirror means coupled to the collector of said sixth transistor for supplying a current proportionate to the current in the collector of said sixth transistor, to the bases of said fourth and fifth transistors;
   a second current source connected between the bases of said fourth and fifth transistors and said first power-supply potential terminal; and
   voltage-signal supplying means for supplying a voltage signal to said first current input terminal, whereby output currents corresponding to the voltage signal are generated from said first and second current output terminals, respectively.

5. The current mirror circuit according to claim 4, wherein said first current mirror means includes a seventh transistor having a collector and a base, both connected to the collector of said third transistor, and an emitter coupled to a second power-supply potential terminal, and an eighth transistor having a base connected to the base of said seventh transistor, an emitter coupled to said second power-supply potential terminal, and a collector coupled to the bases of said first and second transistors; and said second current mirror means includes a ninth transistor having a collector and a base, both connected to the collector of said sixth transistor, and an emitter coupled to said second power-supply potential terminal, and a tenth transistor having a base connected to the base of said ninth transistor, an emitter coupled to said second power-supply potential terminal, and a collector coupled to the bases of said fourth and fifth transistors.

6. A current mirror circuit comprising:
   a current input terminal;
   a current output terminal;
   input-current supplying means for supplying an input current to said current input terminal;
   a first transistor having a collector coupled to said current input terminal, an emitter coupled to a first power-supply potential terminal, and a base;
   a second transistor having a collector connected to the current output terminal, an emitter coupled to the first power-supply potential terminal, and a base connected to the base of said first transistor;
   a third transistor having a base connected to the collector of said first transistor, an emitter coupled to the first power-supply potential terminal by a resistor, and a collector;
   a fourth transistor having an emitter connected to the emitter of said third transistor, a base and a collector, both connected to the bases of said first and second transistors;
   current mirror means coupled to the collector of said third transistor for supplying the collector of said fourth transistor with a current which is proportional to the current in the collector of said third transistor.

7. The current mirror circuit according to claim 6, wherein said current mirror means includes a fifth transistor having a collector and a base, both connected to the collector of said third transistor, and an emitter coupled to a second power-supply potential terminal, and a sixth transistor having a base connected to the base of said fifth transistor, an emitter coupled to a second power-supply potential terminal and a collector coupled to the collector of said fourth transistor.

8. The current mirror circuit according to claim 6, further comprising a voltage signal source for supplying a voltage signal to said current input terminal, thereby causing said current mirror circuit to generate an output current at said current output terminal corresponding to the voltage signal.

9. A current mirror circuit comprising:
   first and second current input terminals;
   first and second current output terminals;
   first and second input-current supplying means for supplying an input current to said first and second current input terminals, respectively;
   a first transistor having a base, a collector coupled to said first current input terminal, and an emitter coupled to a first power-supply potential terminal;
   a second transistor having a collector connected to said first current output terminal, an emitter coupled to said first power-supply potential terminal, and a base connected to the base of said first transistor;
   a third transistor having a collector, a base coupled to the collector of said first transistor, and an emitter coupled to said first power-supply potential terminal by a first resistor;

a fourth transistor having an emitter connected to the emitter of said third transistor, and a base and a collector, both connected to the bases of said first and second transistors;

first current mirror means coupled to the collector of said third transistor for supplying the collector of said fourth transistor with a current which is proportional to the current in the collector of said third transistor;

a fifth transistor having a base, a collector coupled to said second current input terminal, and an emitter coupled to said first power-supply potential terminal;

a sixth transistor having a collector connected to said second current output terminal, an emitter coupled to the emitter of said second transistor, and a base connected to the base of said fifth transistor;

a seventh transistor having a collector, a base coupled to the collector of said fifth transistor, and an emitter coupled to said first power-supply potential terminal by a second resistor;

an eighth transistor having an emitter connected to the emitter of said seventh transistor, and a base and a collector, both connected to the bases of said fifth and sixth transistors;

second current mirror means coupled to the collector of said seventh transistor for supplying the collector of said eighth transistor with a current which is proportional to the current in the collector of said seventh transistor;

voltage-signal supplying means for supplying a voltage signal to said first current input terminal, whereby output currents corresponding to the voltage signal are generated from said first and second current output terminals, respectively.

10. The current mirror circuit according to claim 9, wherein said first current mirror means includes a ninth transistor having a collector and a base, both connected to the collector of said third transistor, and an emitter coupled to a second power-supply potential terminal, and a tenth transistor having a base connected to the base of said ninth transistor, an emitter coupled to said second power-supply potential terminal, and a collector coupled to the collector of said fourth transistor; and said second current mirror means includes an eleventh transistor having a collector and a base, both connected to the collector of said seventh transistor, and an emitter coupled to said second power-supply potential terminal, and a twelfth transistor having a base connected to the base of said eleventh transistor, an emitter coupled to said second power-supply potential terminal, and a collector coupled to the collector of said eighth transistor.

* * * * *